United States Patent [19]

Gibson et al.

[11] 3,709,741

[45] Jan. 9, 1973

[54] IMPURITY PATTERNS PRODUCED BY ION IMPLANTATION

[75] Inventors: Walter Maxwell Gibson, Basking Ridge, N.J., Andrew Rhodes Hutson, Summit, N.J.

[73] Assignee: Bell Telephone Laboratories Incorporated, Murray Hill, N.J.

[22] Filed: Sept. 9, 1970

[21] Appl. No.: 70,698

[52] U.S. Cl. ...........148/1.5, 252/62.3 R, 252/62.3 E

[51] Int. Cl. ..............................H01l 3/00, H01l 7/54

[58] Field of Search....148/1.5; 117/933; 252/62.3 E, 252/62.3 R

[56] References Cited

UNITED STATES PATENTS

| | | | |
|---|---|---|---|
| 3,551,213 | 12/1970 | Boyle | 148/1.5 |
| 3,326,176 | 6/1967 | Sibley | 148/1.5 UX |

OTHER PUBLICATIONS

Datz et al. "Annual Review of Nuclear Science," Vol. 17, 1967, Pages 181–184.

*Primary Examiner*—Oscar R. Vertiz
*Assistant Examiner*—J. Cooper
*Attorney*—R. J. Guenther and Edwin B. Cave

[57] ABSTRACT

Stripe or spot patterns of impurities or dopants on a very fine scale are produced in solid surfaces by high energy ion bombardment through at least one thin screening crystal. The ions are channeled through the screening crystal and interact with the next crystal to produce a moire pattern of the bombarding ions at the surface of a substrate. The substrate can be the second crystal or a third solid body intercepting the beam emerging from a thin second crystal.

2 Claims, 6 Drawing Figures

INVENTORS W. M. GIBSON
A. R. HUTSON
BY George S. Indig
ATTORNEY

IMPURITY PATTERNS PRODUCED BY ION IMPLANTATION

BACKGROUND OF THE INVENTION

1. Field Of The Invention

Solid substrates are processed so as to introduce patterns of impurity atoms for uses such as the formation of PN junctions in semiconductors.

2. Description Of The Prior Art

The most widely used technique for producing patterns of impurity atoms on solid surfaces, for instance in semiconductor processing, is the photolithographic technique. In this technique a layer of light sensitive material is placed over the substrate surface and selected portions of this material exposed to light. The accuracy of this technique and the minimum dimensions which can be controlled are limited by the diffraction of the exposing light. This diffraction is, of course, dependent upon the wavelength of the light used, of the order of a few thousand Angstroms. The smallest scale patterns which have been thus far produced by this technique are exemplified by stripes approximately one micron wide separated by one micron wide space. The fabrication of devices having higher frequency response and higher resolution require techniques which can produce patterns of impurities on a much smaller scale.

SUMMARY OF THE INVENTION

A method has been found which allows the production of simple stripe or spot patterns of impurity atoms on a much smaller scale than possible by photolithographic techniques. In this method a beam of high energy ions of the desired impurity species is incident on a thin crystal plate in a crystal direction which exhibits the channeling phenomenon. A large fraction of the incident particles emerge from the thin crystal between the channeling planes and are incident on a second crystal which is suitably oriented so as to exhibit the channeling phenomenon. If the spacing between the channeling planes of the second crystal is slightly different from the spacing between the channeling planes of the first crystal or if the second crystal is rotated slightly relative to the first crystal a moire pattern of stripes or spots is generated. This moire pattern is on a scale which depends upon the lattice spacing difference or angular rotation. This scale can typically range from 10 to 1,000 lattice spacings which is one or more orders of magnitude smaller than the smallest scale patterns produced by photolithographic techniques.

DETAILED DESCRIPTION OF THE INVENTION

Channeling

When high energy ion beams are incident upon crystalline substrates in certain symmetry directions it is well known that there are effectively two depth ranges for the implanted particles. The ions must be sufficiently energetic that their effective wavelength (de Broglie wavelength) is much smaller than the crystal lattice spacing. The shorter range, called the random beam range, corresponds to that which would obtain upon the bombardment of amorphous material with the same chemical makeup. The long range results from the channeling effect (Datz et al. "Motion of Energetic Particles in Crystals," *Annual Review of Nuclear Science*, Vol. 17, 1967, page 129), where, for particular angles and positions of incidence, the incident particles are steered away from close collision with the atomic cores of the crystal by a cooperative series of gentle collisions. The channeled beams are said to be axial, corresponding to passage along a symmetry direction through a "hole" in the lattice; or planar, corresponding to propagation guided by symmetry planes in the lattice. When ion energies of the order of ten thousand to one million electron volts are used the random beam range is, typically, less than a micron (e.g., 0.1 to 1 micron). In such cases the channeled beam range is, typically, greater than a micron (e.g., 1 to 10 microns) with, typically, a 3 to 1 ratio between the ranges.

Figure 1:
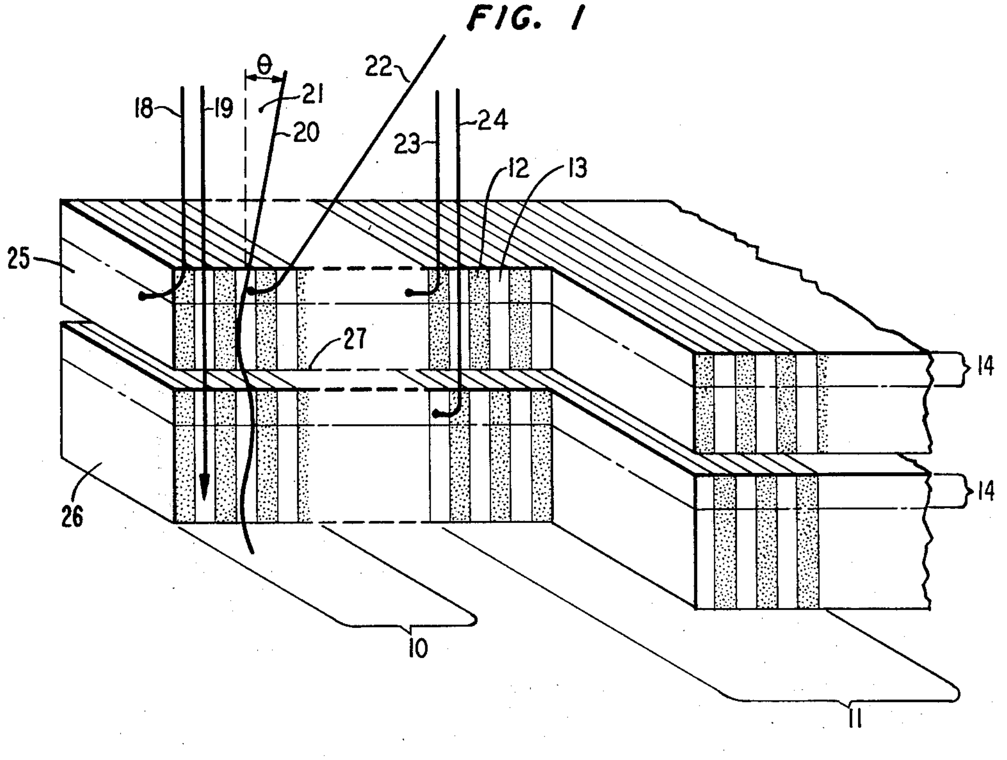
FIG. 1 is a perspective view partly in section of two juxtaposed crystals illustrating various aspects of the channeling phenomenon and the moire effect.

FIG. 1 illustrates various aspects of planar channeling. Here the atomic planes 12 are shown shaded and the spaces between the planes 13 are clear. If a high energy ion beam (18 through 24) is incident on a crystal 25 in a channeling direction and if the thickness of the crystal lies between the range of the random beam 14 and that of the channeled beam, the beam which exits from the back surface of this crystal 25 will consist almost entirely of channeled particles. At the exit surface, the channeled beam will be present only in the spaces 13 between the crystal channeling planes 12 so that this crystal can be considered to be a masking crystal. If this exit beam is incident upon a second crystal in a channeling direction, then the range of the particles 19 in the second crystal will be longer where the channels of the second crystal are in registry 10 with the channels of the first crystal and the range will be short 24 where the channels of the second crystal 26 are in antiregistry 11 with the channels of the first crystal 25.

Patterns

Taken together, the channels at the exit face of the first crystal and at the entrance face of the second crystal can form a moire pattern. The moire pattern consists of a regular array of registry and antiregistry. The scale of the pattern will be larger than the crystal lattice spacing yet can be small compared with optical wavelengths, since lattice spacings are typically several thousand times smaller than optical wavelengths. The result of this moire pattern at the interface between the first, 25, and the second, 26, crystals will be a corresponding moire pattern of the deep doping of the second crystal underneath a fairly uniformly doped random scattering layer. It may, or some uses, be desirable to remove this uniformly doped layer to expose the underlying moire. If the second crystal is sufficiently thin compared with the channeled range, there will be a moire pattern of the beam exiting from the second crystal. This moire patterned beam exiting from the second crystal may be used for ion implantation of any target crystalline or amorphous.

Figure 2:
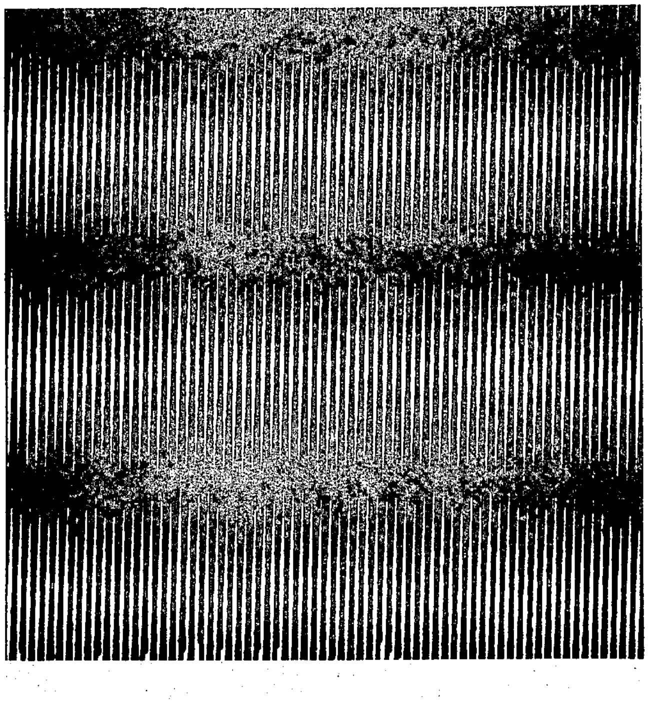
FIG. 2 is an illustration of a rotational moire pattern produced by a small relative rotation of two sets of equally spaced lines.

A number of moire patterns can be produced by this two-crystal channeling technique. The two simplest patterns are rotational moires (see FIG. 2) in which two identical crystals are given a small relative rotation about the channeling direction and parallel moires (see FIG. 3) in which the rows of atoms at the ends of the channeling planes are parallel but where there is a small difference in the inter-planar spacing of the two crystals.

Figure 3:
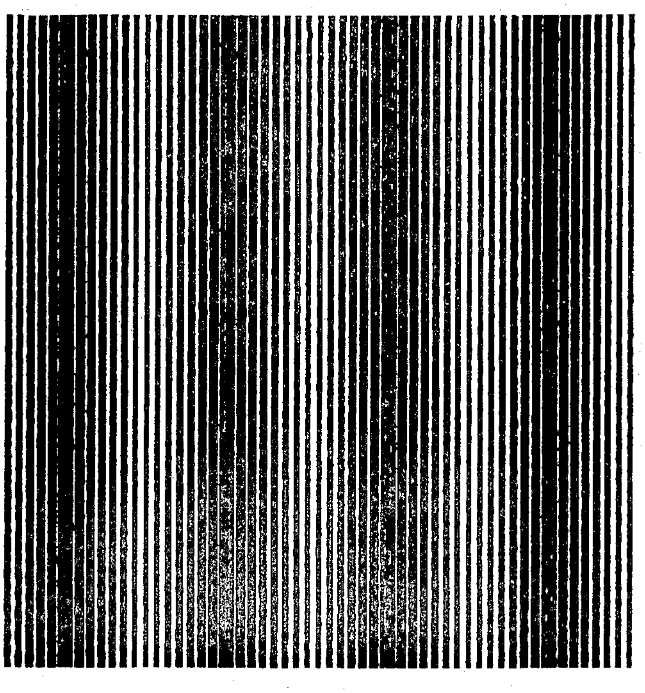
FIG. 3 is an illustration of a parallel moire pattern produced by the superposition of two parallel sets of lines of slightly different spacing.
Figure 4:
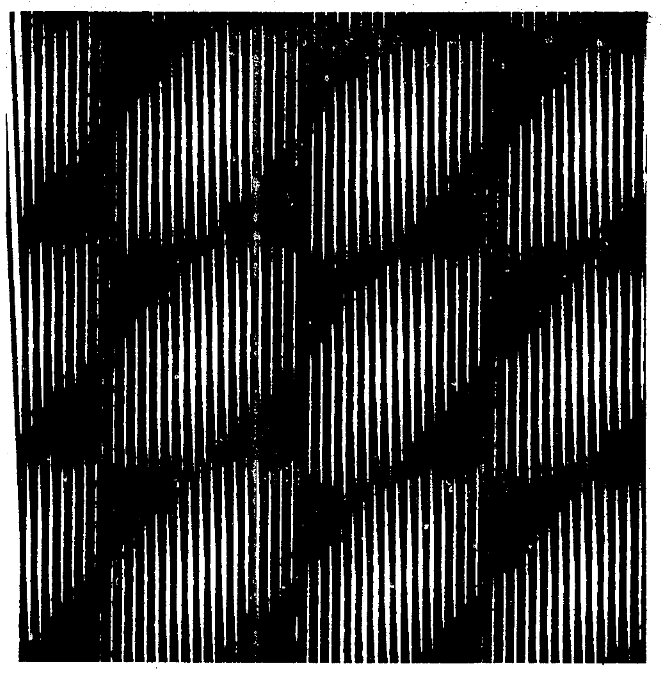
FIG. 4 is an illustration of a moire pattern produced by the superposition of a rotational and a parallel moire pattern.

The line pattern of a rotational moire has a spacing $D$, given by the formula $$D=d/\phi$$

where $d$ is the lattice spacing of the channeling planes and $\phi$ is the angle of relative rotation. The moire lines are perpendicular to the direction of the channeling planes. The line pattern of the parallel moire has a spacing, $D$, given by the formula $$D=\frac{d_1 d_2}{|d_1-d_2|}$$

when $d_1$and $d_2$ are the lattice spacing of the channeling planes of the first and second crystals. For the parallel moire, as illustrated in FIG. 3, the moire lines are parallel to the channeling planes. A moire pattern of spots, as illustrated in FIG. 4, can be generated by superimposing the rotational and parallel moire effects. This can be done, for instance, by the incidence of a parallel moire emerging from a thin second crystal 26 upon a slightly rotated third crystal.

Tolerances

Channeled particles need not be incident at precisely the channeling direction 18, 19, 23, 24. Particles 20 incident at a small angle $\theta$ relative to the channeling direction will also be channeled. Such particles will be channeled if they are incident at an angle which is less than a certain angle, $\theta_c$. Particles 22 incident at an angle larger than $\theta_c$ are scattered into the random beam and come to rest within the random beam range 14. A theoretical expression has been derived for the angle $\theta_c$ (Erginsoy, "Anisotropic Effects in Interactions of Energetic Charged Particles in a Crystal Lattice") *Physical Review Letters*, Vol. 15,(1956) 360.

$$\theta_c=[V(\rho)/E]^{1/2}$$

where $E$ is the particle energy and $V$ is the average potential at the distance of closest approach, $\rho$, of the channeled particle to the channeling plane. The derived expression for $V$ is:

$$V=(2\pi Z_1 Z_2 e^2 a/A)\left[\frac{0.1}{6}\exp\left(-\frac{6\rho}{a}\right)+\frac{0.55}{1.2}\exp\left(-\frac{1.2\rho}{a}\right)+\left(\frac{0.35}{0.3}\right)\exp\left(-\frac{0.3\rho}{a}\right)\right]$$

Here $Z_1$ is the proton number of the incident particle, $Z_2$ is the proton number of the atoms making up the channeling plane, $(1/A)$ is the atomic density in the plane, and $\rho$ is approximately equal to $a$, the Thomas-Fermi screening radius (Schiff, "Quantum Mechanics," *McGraw-Hill* (1955) 170–171). These formulas are not to be considered as precise. However, one skilled in the art can make use of them in order to obtain a good estimate of the accuracy to which he must work. $\theta_c$ angles vary from a maximum of approximately 5° to a minimum of approximately 0.1°.

Pattern Production

The production of parallel moires depends upon a difference in the spacing between the channeling planes of the first crystal through which the particles pass and those of the second crystal. There are a number of ways to produce this difference. The two crystals may be maintained at different temperatures thus producing a different lattice spacing or one of the crystals may be maintained in a state of mechanical strain. Channeling planes of different crystal symmetry can be used with crystals of the same composition or crystals which differ somewhat in composition can be used if this compositional difference leads to a difference of lattice spacing. Generally the spacing difference should be kept to within 5 percent for best pattern production. The crystals may also be rotated slightly relative to one another about an axis perpendicular to the channeling direction and parallel to the channeling planes.

The angle $\theta_c$ is a measure of the angular spread of the exit beam from the channeling crystal. Since the definition of the moire pattern is degraded if the beams from adjacent channels substantially overlap, the allowable separation, $S$, between the juxtaposed exit and entrance faces also depends on $\theta_c$ . For maximum definition the separation, $S$, should be less than $(d/20_c)$, where $d$ is the interplanar spacing. A separation five times larger still leaves some moire effect, although a somewhat more restricted value of three times as large is preferable.

Exemplary Materials

The invention can be applied to both crystalline and amorphous materials as described above and for many purposes. However, the most obvious purpose at the present time is the impurity doping of semiconducting crystals. A typical example of this is the doping of a silicon crystal with boron ions. If 200 kev boron ions are incident on a silicon crystal in a {110} planar channeling direction, the angle, $\theta_c$, is approximately 1°, the range of the random beam is 0.9 micron and the range of the channeled beam is 3 microns.

For pattern production requiring screening crystals of slightly different lattice constant, mixed crystals of silicon and germanium with varying mixture ratios can be used.

Exemplary Uses

Figure 6:
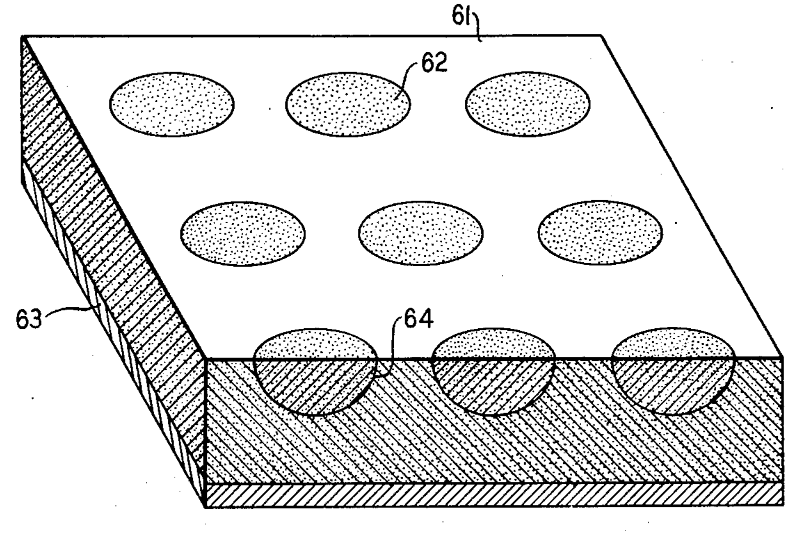
FIG. 6 is a perspective view partly in section of a device using spot PN junctions.

There are many uses to which this technique can be put. High frequency transistors and other active solid state devices require closely spaced stripes of impurity doping. The more closely spaced these stripes can be the higher the frequency of the device which can be produced. In FIG. 6 spots of doping 62 are used in the solid state vidicon tube to produce island junctions 64 which are accessed by a scanning electron beam. The closer the spacing of these spots the better the achievable resolution of the vidicon tube which is then limited only by the scanning beam.

Figure 5:
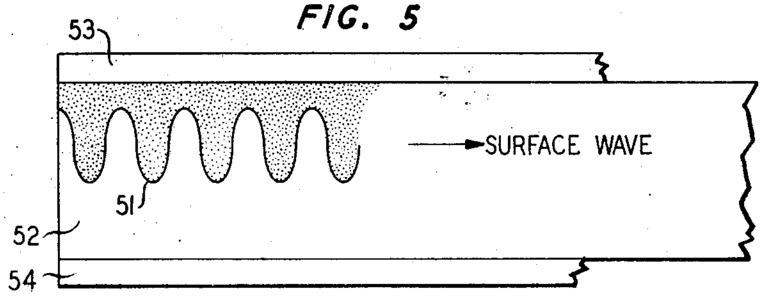
FIG. 5 is a plane view in section of an exemplary surface wave transducer device.

FIG. 5 shows the production of a depth modulated PN junction 51 produced in a slab 52 of semiconducting material. High frequency excitation of metallic contacts 53, 54 will produce a periodically varying electric field component parallel to the surface across the PN junction 51. This component will be coupled by the piezoelectric effect to a high frequency acoustic surface wave. Thus the disclosed technique is used to produce a high frequency acoustic transducer. The above are merely exemplary of the many possible uses.

What is claimed is: What is claimed is:

1. Method for the introduction of elemental ions into a substrate, comprising the high energy implantation of the said ions into the said substrate characterized in that before reaching the said substrate the said ions pass through a masking wherein a portion of said ions is randomly scattered forming a random beam and a portion of said ions is channeled forming a channeled beam, channeled beam and is separated from the said substrate by a spacing less than $S$, where $S$ is determined by the formula $S = 5d/20_c$, where $d$ is the lattice spacing of the channeling planes and $\theta_c$ is an angle of less than 5° given by the formula $\theta_c = [V(\rho)/E]^{1/2}$where $E$ is the energy of the ion and $V(\rho)$ is the average potential at the distance of closest approach, $\rho$, of the channeled ion to the channeling plane, which said substrate is crystalline with one set of channeling planes whose interplanar separation is within 5 percent of the interplanar separation of the said channeling planes of the said masking cyrstal, which said substrate and masking crystal are fixed relative to one another such that their respective said channeling directions are within an angle of plus or minus $\theta_c$ of one another, whereby a moire pattern of the said implanted ions is produced in the said substrate.

2. Method for the introduction of elemental ions into a substrate, comprising the high energy implantation of the said ions into the said substrate characterized in that before reaching the said substrate the said ions pass consecutively through two masking crystals the first of which said masking crystals possesses a first set of channeling planes whose interplanar spacing is within 5 percent of the interplanar spacing of a second set of channeling planes possessed by the second of wherein a portion of said ions is randomly scattered forming a random beam and a portion of said ion is channeled forming a channeled beam, channeled beam and the second of which masking crystal is separated from the said substrate and from the first of the said masking crystals by a spacing less than $S$, where $S$ is determined by the formula $S = 5d/20_c$where the said $\theta_c$ is an angle of less than 5° given by the formula $\theta_c = [V(\rho)/E]^{1/2}$which two said masking crystals are fixed relative to one another such that their respective said channeling directions are within an angle of plus or minus $\theta_c$ of one another, whereby a moire pattern of the said implanted ions is produced in the said substrate.

* * * * *